US006789175B2

(12) United States Patent
Ryan et al.

(10) Patent No.: US 6,789,175 B2
(45) Date of Patent: Sep. 7, 2004

(54) METHOD AND APPARATUS FOR SYNCHRONOUS DATA TRANSFERS IN A MEMORY DEVICE WITH SELECTABLE DATA OR ADDRESS PATHS

(75) Inventors: Kevin J. Ryan, Eagle, ID (US); Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 241 days.

(21) Appl. No.: 09/974,350

(22) Filed: Oct. 9, 2001

(65) Prior Publication Data

US 2002/0016885 A1 Feb. 7, 2002

Related U.S. Application Data

(62) Division of application No. 09/663,035, filed on Sep. 15, 2000, now Pat. No. 6,415,340, which is a division of application No. 09/301,422, filed on Apr. 28, 1999, now Pat. No. 6,272,608, which is a division of application No. 08/891,097, filed on Jul. 10, 1997, now Pat. No. 6,044,429.

(51) Int. Cl.[7] .............................................. G06F 13/16
(52) U.S. Cl. ..................... 711/151; 711/147; 710/52; 710/44
(58) Field of Search .............................. 710/5, 52, 54, 710/39, 40, 44, 244; 365/189.05, 189.07; 711/151, 147–149

(56) References Cited

U.S. PATENT DOCUMENTS

| 4,064,369 A | 12/1977 | Battocletti |
| 4,095,093 A | 6/1978 | Miles |
| 4,096,402 A | 6/1978 | Schroeder et al. |
| 4,404,474 A | 9/1983 | Dingwall |
| 4,464,754 A | 8/1984 | Stewart et al. |
| 4,611,337 A | 9/1986 | Evans |
| 4,638,187 A | 1/1987 | Boler et al. |
| 4,663,742 A | 5/1987 | Andersen et al. ........... 365/189 |
| 4,682,167 A | 7/1987 | Ikeda et al. |
| 4,789,796 A | 12/1988 | Foss |
| 4,884,270 A | 11/1989 | Chiu et al. |
| 4,928,281 A | 5/1990 | Kurosawa et al. |

(List continued on next page.)

FOREIGN PATENT DOCUMENTS

| EP | 0 450 871 A2 | 10/1991 |
| EP | 0 655 741 A2 | 5/1995 |
| EP | 0 680 049 A2 | 11/1995 |

(List continued on next page.)

OTHER PUBLICATIONS

Anonymous, Descriptive literature entitled, "400MHz SLDRAM, 4M X 16 SLDRAM Pipelined, Eight Bank, 2.5 V Operation," SLDRAM Consortium Advance Sheet, published throughout the United States, pp. 1–22.

(List continued on next page.)

Primary Examiner—B. James Peikari
(74) Attorney, Agent, or Firm—Dorsey & Whitney, LLP

(57) ABSTRACT

A synchronous dynamic random access memory ("SDRAM") operates with matching read and write latencies. To prevent data collision at the memory array, the SDRAM includes interim address and interim data registers that temporarily store write addresses and input data until an available interval is located where no read data or read addresses occupy the memory array. During the available interval, data is transferred from the interim data register to a location in the memory array identified by the address in the interim array register. In one embodiment, the SDRAM also includes address and compare logic to prevent reading incorrect data from an address to which the proper data has not yet been written. In another embodiment, a system controller monitors commands and addresses and inserts no operation commands to prevent such collision of data and addresses.

3 Claims, 9 Drawing Sheets

U.S. PATENT DOCUMENTS

| | | | |
|---|---|---|---|
| 4,933,901 A | * 6/1990 | Tai et al. | 365/189.07 |
| 4,933,910 A | 6/1990 | Olson et al. | 365/238.5 |
| 4,958,088 A | 9/1990 | Farah-Bakhsh et al. | |
| 4,984,204 A | 1/1991 | Sato et al. | 365/189.11 |
| 5,088,023 A | * 2/1992 | Nakamura et al. | 711/103 |
| 5,111,435 A | 5/1992 | Miyamoto | 365/230.06 |
| 5,122,690 A | 6/1992 | Bianchi | |
| 5,128,560 A | 7/1992 | Chern et al. | |
| 5,128,563 A | 7/1992 | Hush et al. | |
| 5,134,311 A | 7/1992 | Biber et al. | |
| 5,150,186 A | 9/1992 | Pinney et al. | |
| 5,165,046 A | 11/1992 | Hesson | |
| 5,170,074 A | 12/1992 | Aoki | |
| 5,179,298 A | 1/1993 | Hirano et al. | |
| 5,194,765 A | 3/1993 | Dunlop et al. | |
| 5,220,208 A | 6/1993 | Schenck | |
| 5,239,206 A | 8/1993 | Yanai | |
| 5,254,883 A | 10/1993 | Horowitz et al. | |
| 5,274,276 A | 12/1993 | Casper et al. | |
| 5,274,799 A | 12/1993 | Brant et al. | |
| 5,276,642 A | 1/1994 | Lee | 365/189.04 |
| 5,278,460 A | 1/1994 | Casper | |
| 5,281,865 A | 1/1994 | Yamashita et al. | |
| 5,303,364 A | 4/1994 | Mayer et al. | |
| 5,311,481 A | 5/1994 | Casper et al. | |
| 5,321,368 A | 6/1994 | Hoelzle | |
| 5,347,177 A | 9/1994 | Lipp | |
| 5,347,179 A | 9/1994 | Casper et al. | |
| 5,361,002 A | 11/1994 | Casper | |
| 5,361,263 A | 11/1994 | Urbansky | |
| 5,383,157 A | 1/1995 | Phelan | |
| 5,387,809 A | 2/1995 | Yamagishi et al. | |
| 5,390,308 A | 2/1995 | Ware et al. | |
| 5,400,283 A | 3/1995 | Raad | 365/203 |
| 5,436,911 A | 7/1995 | Mori | |
| 5,438,545 A | 8/1995 | Sim | 365/189.05 |
| 5,440,260 A | 8/1995 | Hayashi et al. | |
| 5,457,407 A | 10/1995 | Shu et al. | 326/30 |
| 5,467,473 A | 11/1995 | Kahle et al. | |
| 5,471,591 A | 11/1995 | Edmondson et al. | |
| 5,473,575 A | 12/1995 | Farmwald et al. | 365/230.06 |
| 5,475,642 A | 12/1995 | Taylor | 365/203 |
| 5,481,497 A | 1/1996 | Yamauchi et al. | 365/189.05 |
| 5,483,497 A | 1/1996 | Mochizuki et al. | 365/230.03 |
| 5,497,127 A | 3/1996 | Sauer | |
| 5,498,990 A | 3/1996 | Leung et al. | |
| 5,506,814 A | 4/1996 | Hush et al. | 365/230.03 |
| 5,508,638 A | 4/1996 | Cowles et al. | 326/38 |
| 5,513,327 A | 4/1996 | Farmwald et al. | |
| 5,537,352 A | 7/1996 | Meyer et al. | 365/189.02 |
| 5,546,537 A | 8/1996 | McClure | |
| 5,548,786 A | 8/1996 | Amini et al. | |
| 5,568,077 A | 10/1996 | Sato et al. | |
| 5,574,698 A | 11/1996 | Raad | 365/230.06 |
| 5,576,645 A | 11/1996 | Farwell | |
| 5,578,941 A | 11/1996 | Sher et al. | 326/34 |
| 5,581,197 A | 12/1996 | Motley et al. | 326/30 |
| 5,590,073 A | 12/1996 | Arakawa et al. | 365/185.08 |
| 5,619,473 A | 4/1997 | Hotta | 365/238.5 |
| 5,621,690 A | 4/1997 | Jungroth et al. | 365/200 |
| 5,627,780 A | 5/1997 | Malhi | 365/185.09 |
| 5,627,791 A | 5/1997 | Wright et al. | 365/222 |
| 5,631,872 A | 5/1997 | Naritake et al. | 365/227 |
| 5,636,163 A | 6/1997 | Furutani et al. | 365/189.01 |
| 5,636,173 A | 6/1997 | Schaefer | 365/230.03 |
| 5,636,174 A | 6/1997 | Rao | 365/230.03 |
| 5,638,335 A | 6/1997 | Akiyama et al. | 365/230.03 |
| 5,649,157 A | * 7/1997 | Williams | 711/151 |
| 5,650,971 A | 7/1997 | Longway et al. | 365/207 |
| 5,655,105 A | 8/1997 | McLaury | |
| 5,668,763 A | 9/1997 | Fujioka et al. | 365/200 |
| 5,682,342 A | 10/1997 | Suzuki | |
| 5,691,953 A | 11/1997 | Yeh et al. | 365/230.08 |
| 5,694,065 A | 12/1997 | Hamasaki et al. | |
| 5,717,894 A | 2/1998 | Vivio | |
| 5,729,711 A | * 3/1998 | Okamoto | 711/205 |
| 5,737,276 A | 4/1998 | Shin et al. | 365/230.08 |
| 5,761,147 A | 6/1998 | Lindner et al. | 365/230.05 |
| 5,809,228 A | 9/1998 | Langendorf et al. | |
| RE35,934 E | 10/1998 | Takai | 365/189.05 |
| 5,828,606 A | * 10/1998 | Mick | 365/189.05 |
| 5,831,929 A | 11/1998 | Manning | 365/233 |
| 5,841,717 A | 11/1998 | Yamaguchi | 365/205 |
| 5,847,577 A | 12/1998 | Trimberger | 326/38 |
| 5,854,911 A | 12/1998 | Watkins | |
| 5,870,347 A | 2/1999 | Keeth et al. | 365/230.03 |
| 5,870,625 A | * 2/1999 | Chan et al. | 710/5 |
| 5,903,916 A | 5/1999 | Pawlowski et al. | 711/167 |
| 5,905,874 A | 5/1999 | Johnson | |
| 5,923,594 A | 7/1999 | Voshell | 365/189.05 |
| 5,946,245 A | 8/1999 | Brown et al. | 365/201 |
| 5,956,502 A | 9/1999 | Manning | 713/503 |
| 6,014,759 A | 1/2000 | Manning | 714/42 |
| 6,023,177 A | 2/2000 | Kim et al. | |
| 6,035,393 A | 3/2000 | Glew et al. | 712/237 |
| 6,044,429 A | 3/2000 | Ryan et al. | 710/131 |
| 6,061,772 A | 5/2000 | Webber et al. | 711/169 |
| 6,085,283 A | 7/2000 | Toda | 711/104 |
| 6,088,774 A | 7/2000 | Gillingham | 711/167 |
| 6,091,646 A | 7/2000 | Voshell | 365/189.05 |
| 6,134,634 A | 10/2000 | Marshall, Jr. et al. | 711/143 |
| 6,148,381 A | * 11/2000 | Jotwani | 711/158 |
| 6,154,814 A | 11/2000 | Uesugi | 711/133 |
| 6,233,670 B1 | 5/2001 | Ikenaga et al. | 712/218 |
| 6,374,334 B1 | 4/2002 | Suga et al. | 711/158 |

FOREIGN PATENT DOCUMENTS

| | | |
|---|---|---|
| EP | 0 692 872 A2 | 1/1996 |
| JP | 2-112317 | 4/1990 |
| JP | 4-135311 | 8/1992 |
| JP | 5-136664 | 6/1993 |
| JP | 5-282868 | 10/1993 |
| WO | 97/03445 | 1/1997 |
| WO | 97/14289 | 4/1997 |
| WO | 97/15055 | 4/1997 |

OTHER PUBLICATIONS

Anonymous, "Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Taguchi, M. et al., "A 40–ns 64–Mb DRAM with 64–b Parallel Data Bus Architecture", IEEE Journal of SolidState Circuits, vol. 26, No. 11, Nov. 1991, pp. 1493–1497.

* cited by examiner

METHOD AND APPARATUS FOR SYNCHRONOUS DATA TRANSFERS IN A MEMORY DEVICE WITH SELECTABLE DATA OR ADDRESS PATHS

This application is a divisional of U.S. patent application Ser. No. 09/663,035, filed Sep. 15, 2000, issued as U.S. Pat. No. 6,415,340, which is a divisional of U.S. patent application Ser. No. 09/301,422, filed Apr. 28, 1999, issued as U.S. Pat. No. 6,272,608, which is a divisional of U.S. patent application Ser. No. 08/891,097, filed Jul. 10, 1997, issued as U.S. Pat. No. 6,044,429.

TECHNICAL FIELD

The present invention relates to memory devices, and more particularly, synchronous dynamic access memory devices.

BACKGROUND OF THE INVENTION

Conventional dynamic random access memories (DRAMs) perform data transfer operations in sequence. That is, when a read or write command is received and an address is made available, the data transfer operation, either read or write, is performed in its entirety before another command is accepted. Consequently, subsequent commands are delayed by the entire duration of the original data transfer.

The overall time to perform the original data transfer may be significant, because data transfers typically involve several steps, and each step takes time. For example, for a read operation, control logic of the DRAM must decode the command and address, perform precharge and equilibration, connect a row of memory cells to respective digit lines, allow time for sense amplifiers to develop signals; and transfer data from the sense amplifiers to an output data bus. Subsequent commands must wait until these operations are completed before they are accepted by the DRAM. Consequently, reading from and writing to the DRAM must be sufficiently slow to allow the original data transfer to be completed before a subsequent command is provided.

To reduce the amount of delay imposed in sequential data transfer operations, DRAMs can be "pipelined." In pipelining, each of the above-described steps is performed according to a specific timing sequence. For example, when the original data transfer operation progresses from a first step (e.g., command and address decode) to a second step (e.g., read data), a second data transfer progresses to its first step (command and address decode). Thus, the DRAM's control logic can begin decoding the second command and the DRAM's address decoder can begin decoding the second address while the data from the original data transfer operation is being read from or written to the memory array.

To control the flow of data through a pipelined DRAM, commands and data are transferred synchronously, and such DRAMs are referred to as synchronous DRAMs ("SDRAMs"). In SDRAMs, timing of operations is established relative to the leading edges of a clock signal CLK. At fixed times relative to the leading edges, commands are read by the control logic, addresses are decoded by an address decoder, signals are developed on input and output lines of the memory array, and data is made available for reading or writing at a databus.

In synchronous read operations, an output of data on the data bus results from a read command and an address received at a preceding leading edge of the clock. The delay in number of clock cycles between the arrival of the read command at the control logic input and the availability of the corresponding data at the data bus is the "latency" of the SDRAM. If the output data is available by the second leading edge of the clock following the arrival of the read command, the device is described as a two-latency SDRAM. If the data is available at the third leading edge of the clock following the arrival of the read command, the device is a three-latency SDRAM.

In conventional SDRAMs, latency is only imposed for read operations. In write operations, write commands are supplied simultaneously with data at the data bus. The commands, addresses, and data are transferred to the memory array very quickly, typically within one clock cycle. Typical SDRAMs may thus be described as having no write latency.

FIG. 1 is a block diagram of a conventional synchronous dynamic random access memory 40 ("SDRAM"). The SDRAM 40 has as its central memory element a memory array 42 that is segmented into two banks 44, 46. The SDRAM 40 operates under control of a logic controller 48 that receives a system clock signal CLK, a clock-enable signal CKE, and several command signals that control reading from and writing to the SDRAM 40. Among the command signals are a chip-select signal $\overline{CS}$, a write-enable signal $\overline{WE}$, a column address strobe signal $\overline{CAS}$, and a row address strobe signal $\overline{RAS}$. The overbars for the command signals $\overline{CS}$, $\overline{WE}$, $\overline{CAS}$ and $\overline{RAS}$ indicate that these signals are low-true signals, i.e., the command signals $\overline{CS}$, $\overline{WE}$, $\overline{CAS}$ and $\overline{RAS}$ go to a low logic level when true.

In addition to the command signals, the SDRAM 40 also receives addresses from the address bus 52 and receives or outputs data on a data bus 60. The received addresses may be row or column addresses. In either case, addresses from the address bus 52 are clocked in the SDRAM 40 through an address register or address latch 62. If an address is a row address, the address is transmitted to the array 42 through a row address path 64. The row address path 64 includes a row address multiplexer 66 that receives the external row address from the address latch 62 and receives an internal row address from a refresh circuit 67. The row address multiplexer 66 provides the row addresses to either of two row address latches 70 depending upon the logic state of the bank address BA. The row address latches 70 latch the row addresses and provide the row addresses to respective row decoders 72. The row decoders 72 take the 11-bit address from the row address latch 70 and activate a selected one of 2,048 row address lines 73. The row address lines 73 are conventional lines for selecting row addresses of locations in the memory array 42. As noted above, the following discussion assumes that the row address has been selected and that the selected row is activated.

If the address received at the address latch 62 is a column address, it is transmitted to the I/O interface 54 and the memory array 42 through a column address path 76. The column address path includes a column address counter/latch 78 that receives or increments, and holds the column address from the address latch 62, a multiplexer 79 that receives a column address from either address latch 62 or from counter/latch 78, a pre-decoder 102 and a latch 82. Depending on whether a particular column access is the result of a new command, or if it is a subsequent access in a burst initiated by a previous command, the multiplexer 79 transmits the appropriate column address to the column decoder 84, via the column address pre-decoder 102 and latch 82. For new commands, the multiplexer 79 routes the external address (from the address latch 62) through to the pre-decoder 102 and latch 82. A copy is also captured by the column address counter/latch 78 for incrementing on subsequent accesses. If the device 40 has been programmed for a burst length of 2 or greater, and a new column command is not presented to interrupt a column command issued on the previous clock edge, then the counter/latch 78 will increment (or sequence) to the next column address in the burst, and the multiplexer 79 will route the incremented address to the pre-decoder 102 and latch 82.

The input data path 56 transmits data from the data bus 60 to the I/O interface 54. The output data path 58 transmits data from the I/O interface 54 to the data bus 60. Operation of the column address path 76, input data path 56, and output data path 58 for a selected sequence of read and write commands will be described below with respect to the timing diagram of FIG. 4. The logic controller 48 decodes the command signals according to a predetermined protocol to identify read, write, and other commands for execution by the SDRAM 40. FIGS. 2 and 3 show clock and command signals and their states for write commands and read commands, respectively. The read and write commands differ only in the state of the write-enable signal $\overline{WE}$. Except for the write-enable signal $\overline{WE}$, the following discussion applies equally to FIGS. 2 and 3.

As indicated by the arrow 50, the leading edge of each pulse of the clock signal CLK establishes the time at which the states of the signals are determined. The clocking of the logic controller 48 by the clock signal CLK is enabled by the clock-enable signal CKE, which is high for reading and writing. Also, reading and writing from the SDRAM 40 is enabled only when the SDRAM 40 is selected, as indicated by the chip-select signal $\overline{CS}$.

The next two command signals are the row and column address strobe signals $\overline{RAS}$ and $\overline{CAS}$. When true (low), the row address strobe signal $\overline{RAS}$ indicates addresses on an address bus 52 are valid row addresses. A true (low) column address strobe signal $\overline{CAS}$ indicates that addresses on the address bus 52 are valid column addresses. During reading or writing, the column address strobe signal $\overline{CAS}$ is low (true) indicating that the address bits from the address bus 52 represent the column address, as represented for address signals A0–A10. The row address strobe signal $\overline{RAS}$ is high (not true) because the row address was determined at a different leading clock edge. As is conventional to SDRAM operation, the row address is received and stored and the selected row is activated prior to the column address strobe signal $\overline{CAS}$ going true (low). The following discussion assumes that the selected row has already been activated.

The write-enable signal $\overline{WE}$ becomes active at the same time that the column-address strobe signal $\overline{CAS}$ becomes active. The write-enable signal $\overline{WE}$ is also a low-true signal such that, if the write-enable signal $\overline{WE}$ is low, the data transfer operation will be a write, as shown in FIG. 2. If the write-enable signal $\overline{WE}$ is high, the data transfer operation will be a read, as shown in FIG. 3.

The logic controller 48 decodes the above-described command signals CKE, CLK, $\overline{CS}$, $\overline{WE}$, $\overline{CAS}$, and $\overline{RAS}$ to determine whether a read or write command has been received. In response to the determined command, the logic controller 48 controls reading from or writing to the memory array 42 by controlling an I/O interface 54 and input and output data paths 56, 58. The I/O interface 54 is any conventional I/O interface known in the art, and includes typical I/O interface elements, such as sense amplifiers, mask logic, precharge and equilibration circuitry, and input and output gating.

The following discussion of FIG. 4 assumes that the row address has already been decoded and the appropriate row of the memory array 42 has been activated in response to the row address. As shown in FIG. 4, a first read command READ1 is applied to the logic controller 48 at a leading edge of a first clock pulse at time t0. At substantially the same time, a first read column address RCOL1 is applied to the address bus 52. Over the next two periods of the clock signal CLK, the first read column address RCOL1 travels along the column address path 76 through the address latch 62, the multiplexer 79, the column address predecoder 102 and latch 82 to the column decoder 84 where it is decoded. The decoded read column address RCOL1 reaches the I/O interface 54 by time t2, at the second leading edge following the time t0.

Upon the decoded column address RCOL1 reaching the array 42, the I/O interface 54 reads data DOUT1 stored in the memory location at the decoded column address RCOL1 and provides the data DOUT1 to the output data path 58. The data DOUT1 travel through the output data path 58 and reaches the data bus 60 at time t3, which is three leading edges of the clock signal CLK after the first read command READ1 was received at time t0. The SDRAM 40 is thus a three-latency device because the data DOUT1 are available at the data bus 60 three leading edges of the clock signal CLK after the read command READ1 arrives at time to.

A subsequent read command READ2 and a second column address RCOL2 arrive at time t1, which is the leading edge of the clock signal CLK immediately after the first leading clock edge at time t0. The above-described reading operations occur in response to the second read command READ2 and the second column address RCOL2, with each step shifted to the right by one period of the clock signal CLK relative to the operations of the first read command RCOL1. The data DOUT2 from the second memory location indicated by the column address RCOL2 are applied to the data bus 60 at time t4.

At time t2, a third read command READ3 and third column address RCOL2 are applied to the logic controller 48 and address bus 52, respectively. Once again, the read operations are repeated, one clock period after those of the second read operation. Thus, the data DOUT3 for the third read command READ3 are applied to the output data bus 60 at time t5.

While read operations are performed according to the read latency of the SDRAM 40, there is typically no write latency in the DRAM 40. However, the read latency of the SDRAM 40 can delay the completion of write operations that follow a read operation. FIG. 4 shows an example of an attempt to write data at time t3 immediately following the third read command READ3 at time t2. The write command WRITE1, the column address WCOL1, and the input data DIN1 are all applied to the logic controller 48, the address bus 52, and the data bus 60, respectively, at time t3. The decoded column address WCOL1 and input data DIN1 arrive at the array 42 approximately one clock cycle later. In the example of FIG. 4, the address WCOL1 and data DIN1 take approximately one clock cycle to traverse the column address path 76 and the input data path 56, respectively. However, in some SDRAMs, the data DIN1 and the decoded column address WCOL1 may arrive at the array 42 more quickly or more slowly.

One problem with the above-described timing structure is that at time t3, the input data DIN1 from the first write command WRITE1 and the output data DOUT1 from the first read command READ1 would collide at the data bus 60.

A second data collision occurs when a second write command WRITE2 immediately follows the first write command WRITE1. More specifically, at time t4, input data DIN2 for the second write command WRITE2 reaches the data bus 60 at the same time that output data DOUT2 from the second read command READ2 reach the data bus 60. A third data collision occurs when a third write command WRITE3 immediately follows the second write command WRITE2. This occurs at time t5 when input data DIN3 from the third write command WRITE3 and output data DOUT3 reach the data bus 60 simultaneously.

To prevent such data collisions, most SDRAMs require that write commands be delayed with respect to the read commands so that write commands are not permitted for one or more clock cycles after read commands. Typically, this is achieved by inserting no operation commands NO-OP between read and write commands. While this approach can prevent such collisions, the no operation commands NO-OP lower the effective speed of such SDRAMs because they impose delays in accepting write commands at the SDRAM. Note that this problem does not occur for read commands following write commands since the write command can be processed during the read latency period.

Another approach to preventing such data collisions might be to impose write latencies that equal the read latencies. As used herein, a "write latency" refers to the number of clock cycles between a write command and arrival of data on the data bus 60. Such an approach inherently avoids collisions of data and addresses on a computer's data bus and address bus because data and addresses will follow read and write commands by equal numbers of clock cycles. Thus, as long as the commands are not issued simultaneously, data and addresses will not collide on the data and address busses. One example of such an approach is found in U.S. Pat. No. 5,511,024 to Ware et al.

Unfortunately, this approach does not necessarily overcome the problems of data collisions and address collisions at the memory array 42, as can be seen in FIG. 5. As shown at time t3, a first write command WRITE1 and a first write column address WCOL1 are applied to the SDRAM 40. At time t4 a second write command WRITE2 and second write column address WCOL2 are applied. Input data DIN2 corresponding to the second write command WRITE2 are present on the data bus (DQ) at time t7, assuming a write latency of three. One leading edge later, at time t8, the input data DIN2 and the decoded second column address WCOL2 reach the array 42, assuming the second write address WCOL1 is internally delayed (buffered) and applied to the array 42 at the appropriate time.

At time t6, a fourth read command READ4 and fourth read address RCOL4 are applied to the logic controller 48 and the address bus 52, respectively. The decoded column address RCOL4 reaches the array at time t8 and the data DOUT4 is read from the array at time t8. However, as can be seen in FIG. 5, the decoded column addresses WCOL2 and RCOL4 both reach the array 42 at time t8. Also, the input data DIN2 and output data DOUT4 are being written to and read from the array 42 at time t8. Thus, reading and writing with the same latency might still result in data and address collisions at the array 42. One approach to overcoming this limitation could be to limit reads and writes to separate DRAMs or to separate independent arrays of a multi-array device. This approach still precludes sequential reads and writes at matching latencies within a single memory array. Also, a multi-bank memory array approach would require multiple independent memory arrays and associated column amplifiers to interleave reads from one bank with writes to another bank.

SUMMARY OF THE INVENTION

A synchronous dynamic random access memory ("SDRAM") is configured to perform both read and write operations with the same latency while avoiding data and address collisions internal to the device. In one embodiment of the invention, the SDRAM includes interim address registers in a column address path and interim data registers in an input data path. In response to a write command, corresponding write address and corresponding input data the SDRAM stores the write address in one of the interim address registers and stores the input data in one of the interim data registers.

A logic controller within the SDRAM monitors subsequent commands to determine an available write interval at a memory array in the SDRAM. When the logic controller identifies an upcoming available write interval, the logic controller initiates transfer of the stored address from the interim address register and stored input data from the interim data register to an I/O interface. There, the input data is written to the location corresponding to the address.

The address path includes N+1 registers where N is the latency of the device, so that more than one address can be stored in the interim address registers. Additionally, the input data path includes N interim data registers to store the corresponding input data.

In one embodiment of the invention, the SDRAM also includes a bypass path between the input data path and an output data path. Additionally, the column address path includes an address predecoder and a comparator that compare incoming read addresses with stored addresses in the interim address registers. If the comparator determines that an incoming read address matches a stored write address in one of the interim address registers, the comparator activates a multiplexer in the input data path to transfer data from the corresponding interim data register to the output path. The data from the interim data register is thus provided at an output data bus in place of data from the array. Thus, this embodiment prevents reading from addresses in which data has not yet been updated.

A computer system according to the invention includes a memory controller that controls the SDRAM. With the embodiment described above, the controller need not keep track of buffered addresses for the purpose of avoiding reads to that data. In another embodiment, the memory controller includes interim address and data registers and a comparator to prevent reading of data from address locations that have not yet been updated. In another embodiment, the memory controller identifies attempts to read from addresses that have not yet been updated and inserts no operation commands to allow the data to be written to the array before the read operation is performed.

DETAILED DESCRIPTION OF THE INVENTION

Figure 1:
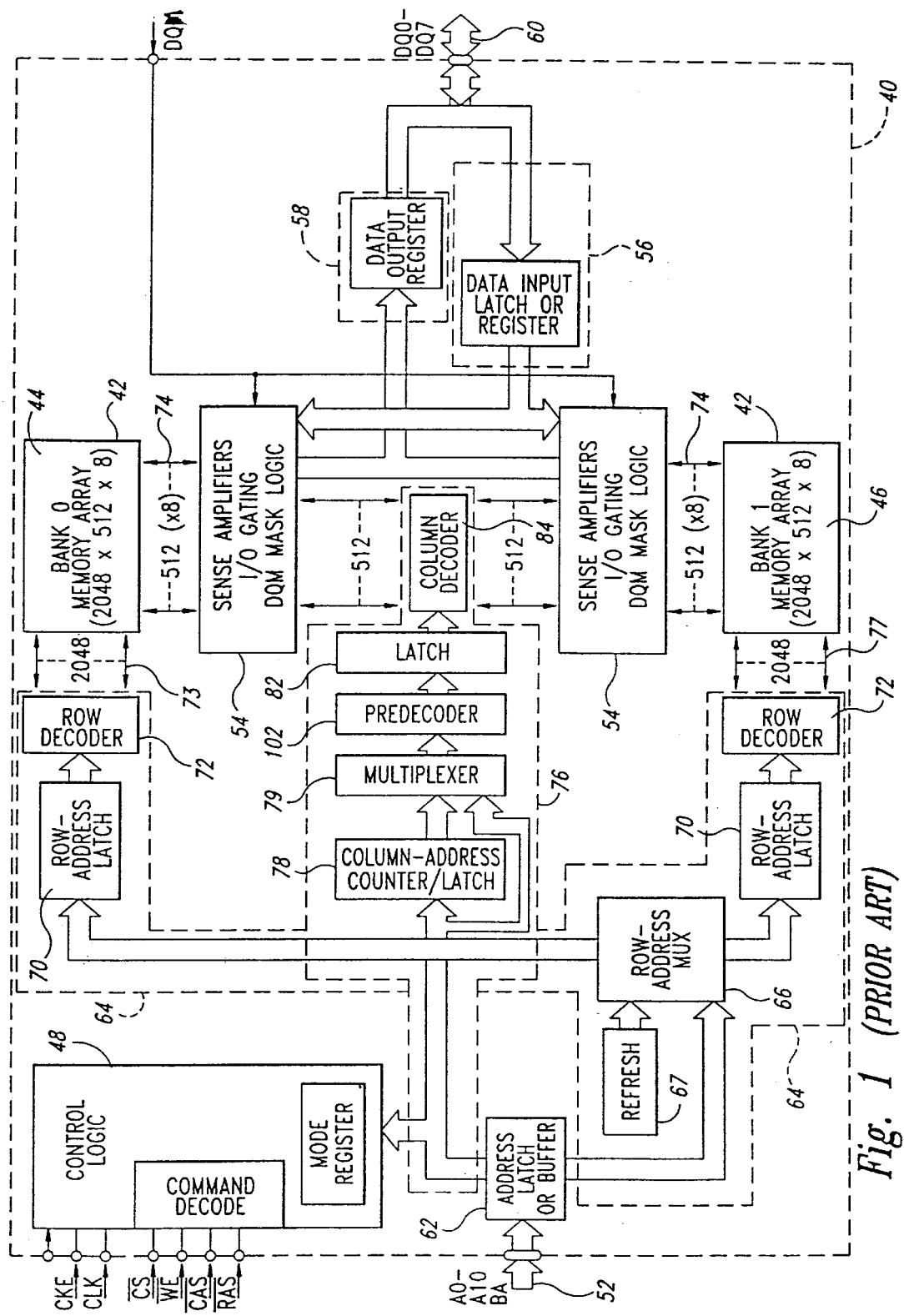
FIG. 1 is a block diagram of a conventional synchronous dynamic random access memory ("SDRAM").
Figure 2:
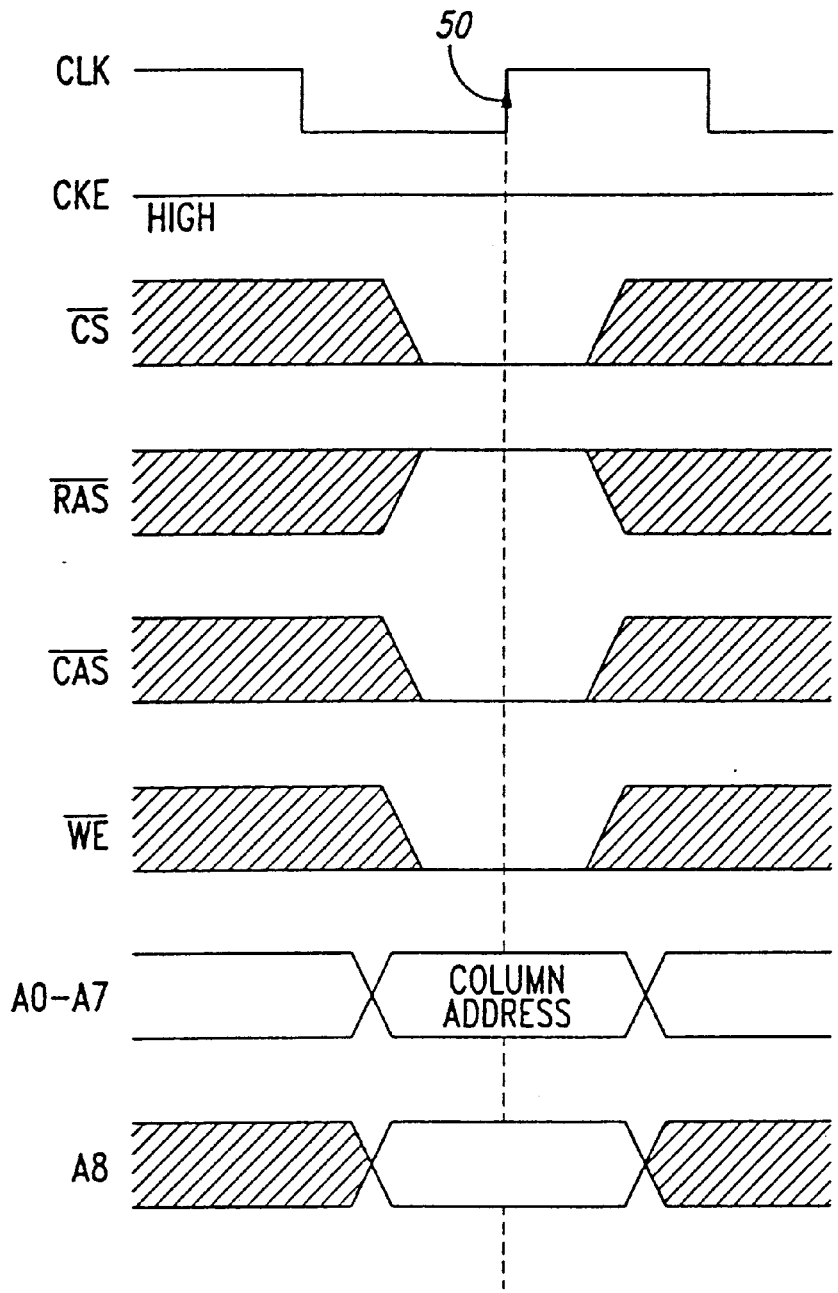
FIG. 2 is a signal timing diagram showing states of various commands signals forming a write command.
Figure 3:
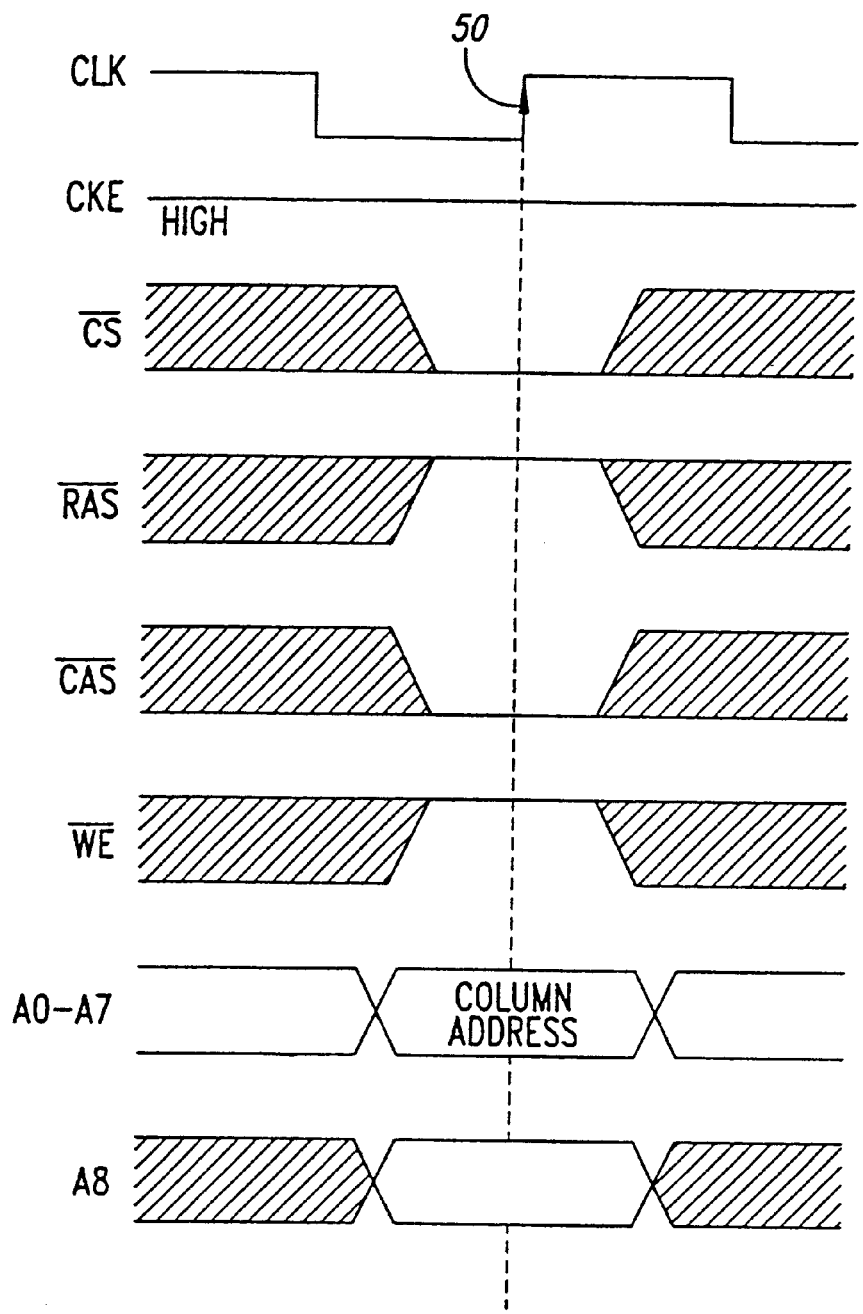
FIG. 3 is a signal timing diagram showing states of various command signals forming a read command.
Figure 4:
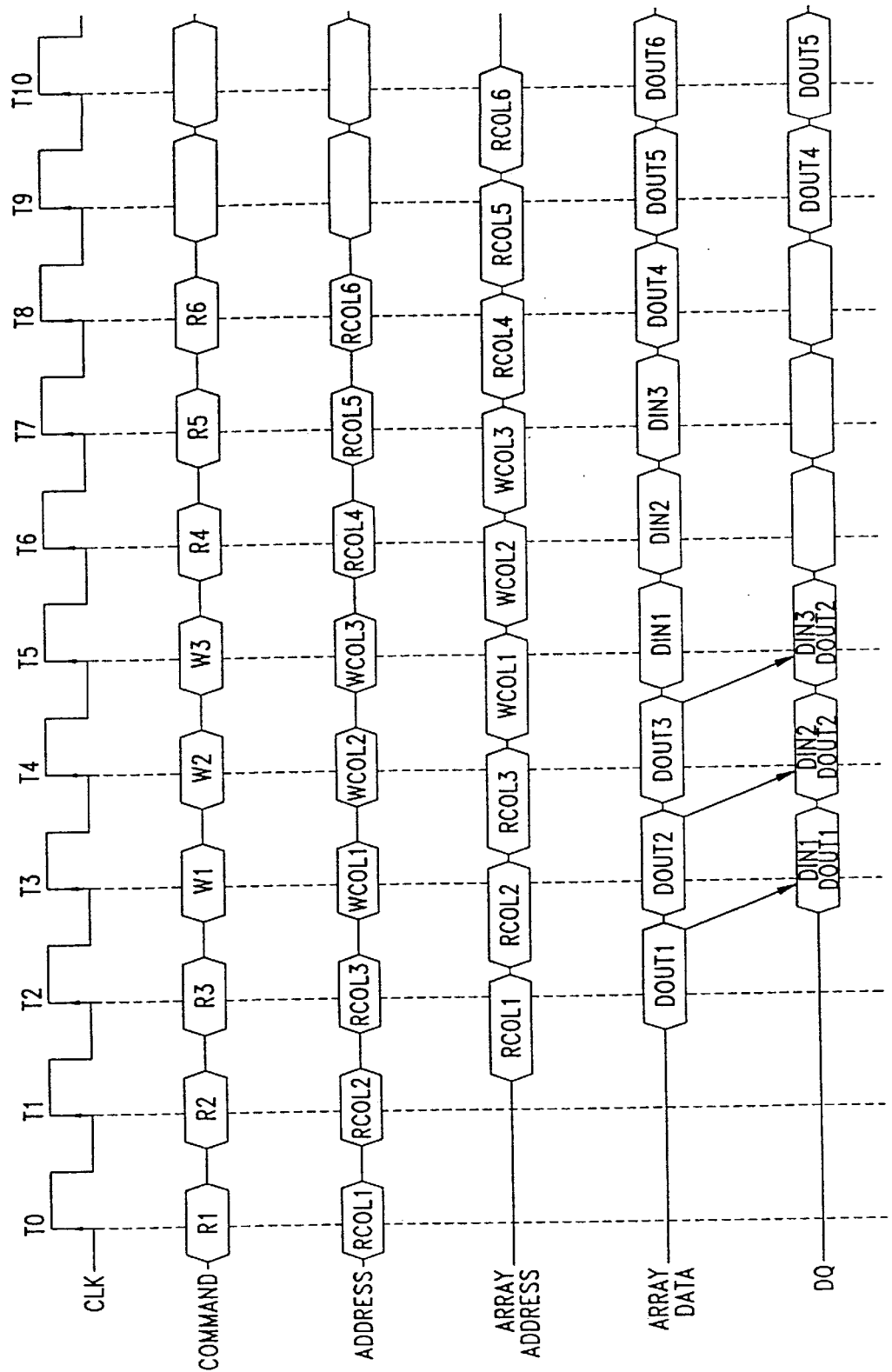
FIG. 4 is a timing diagram of signals for read and write operations within a conventional synchronous dynamic random access memory showing data and address collisions at the memory array and at the data bus.
Figure 6:
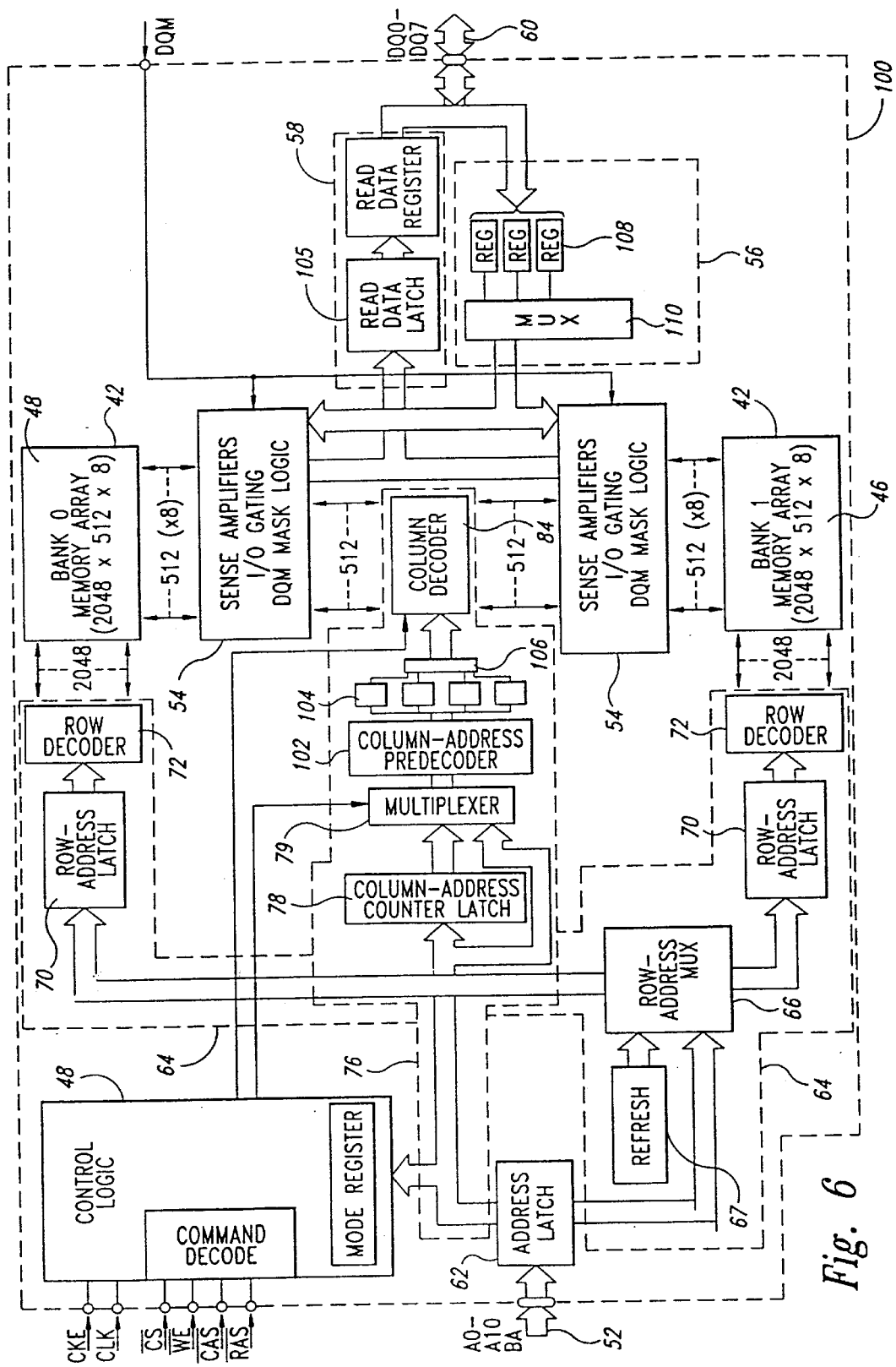
FIG. 6 is a block diagram of an SDRAM according to one embodiment of the invention, including interim address and interim data registers in a column address path and a data input path, respectively.

As shown in FIG. 6, an SDRAM 100 according to one embodiment of the invention operates with equal read and write latencies while avoiding collision at the memory array 42. The SDRAM 100 includes many elements that are identical to or analogous to elements of FIG. 2, where identical or analogous elements are numbered the same. Unlike the SDRAM 40 of FIG. 4, the SDRAM 100 of FIG. 6 includes column interim address registers 104 and an auxiliary address multiplexer 106 in the column address path 76. Also unlike the SDRAM 40 of FIG. 4, the SDRAM 100 of FIG. 6 includes interim data registers 108 and an input data multiplexer 110 in the input data path 56. Further differences in the SDRAM 100 are found in the timing of operations established by the logic controller 48. These timing differences will become apparent as operation of the SDRAM 100 of FIG. 6 is described with reference to the signal timing diagram of FIG. 7.

Figure 5:
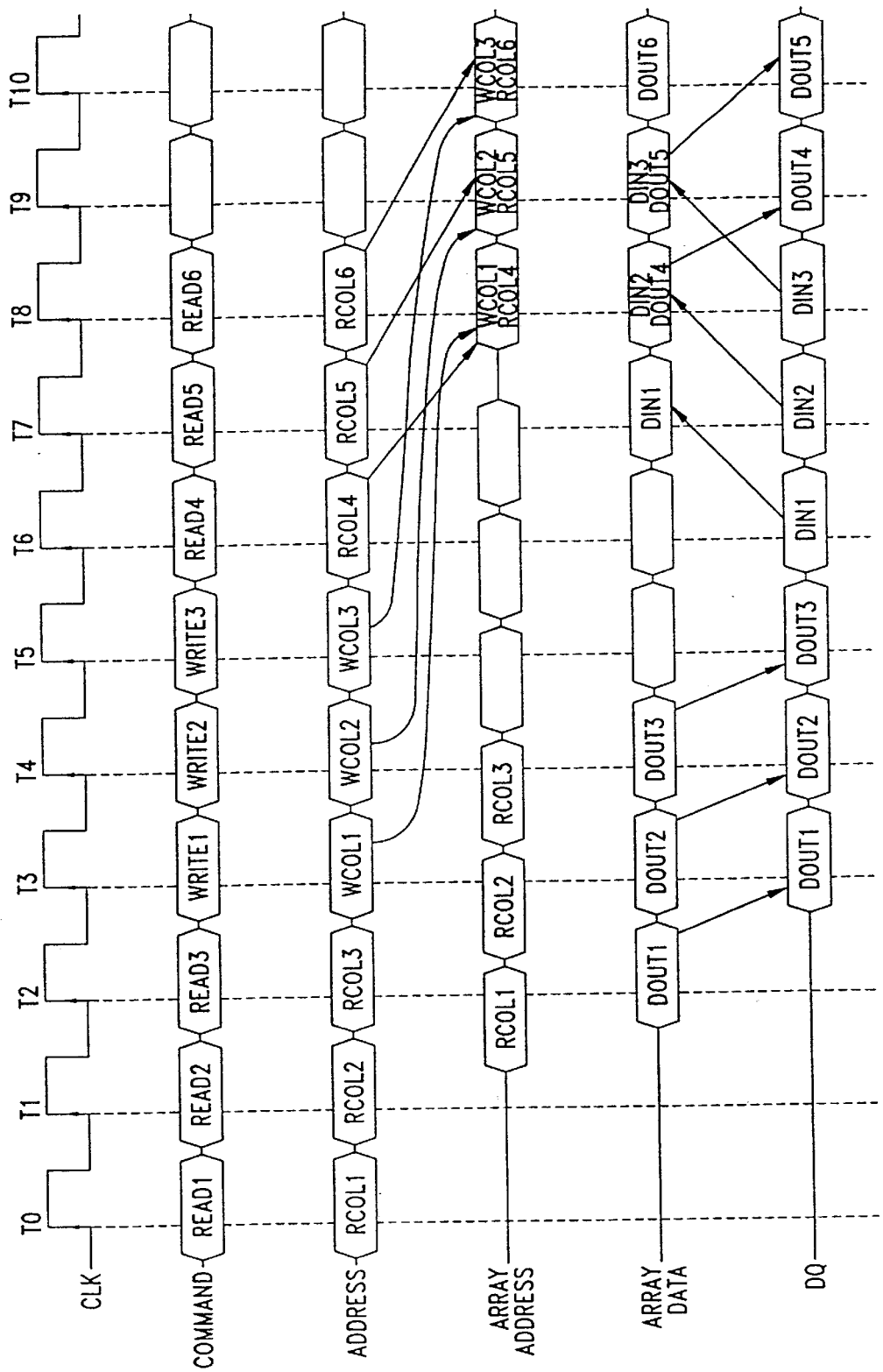
FIG. 5 is a signal timing diagram of four latency read and four latency write operations in a hypothetical SDRAM according to FIG. 1, showing data and address collisions at the memory array.

The SDRAM 100 of FIG. 6 performs both read and write operations with latencies of three. However, unlike the embodiment of FIG. 5, the SDRAM 100 of FIG. 6 avoids data and address collisions by temporarily storing data and addresses in the interim address and data registers 104, 108.

Figure 7:
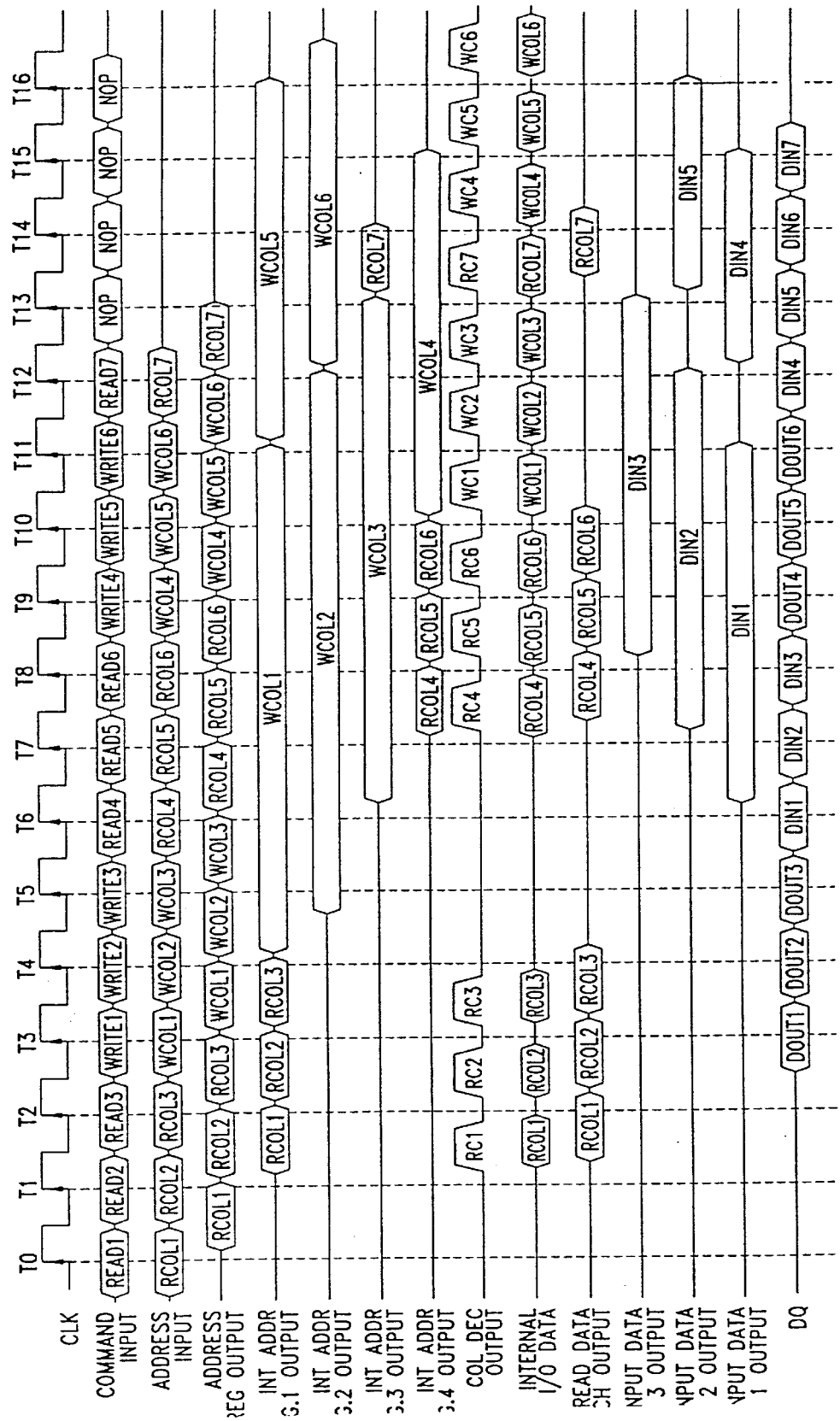
FIG. 7 is a signal timing diagram of signals for four latency read and four latency write operations in the SDRAM of FIGS. 6 and 9.

As seen in FIG. 7, the SDRAM 100 operates according to the same clock signal CLK, read and write commands and input data described above with reference to FIGS. 1–3 and 5. The timing diagram of FIG. 7 shows signals and commands for a series of three read commands followed by three write commands, followed by three read commands. One skilled in the art will recognize that several other series of commands can be applied. However, the series of FIG. 7 shows how the SDRAM 100 of FIG. 6 avoids data and address collisions for any series of commands without requiring no operation commands.

As shown in the first diagram of FIG. 7, at time t0, a first read command READ1 and first read column address RCOL1 are applied to the logic controller 48 and address bus 52, respectively. The read column address RCOL1 passes through the address latch 62 by time t1 and then through the multiplexer 79. The read column address RCOL1 is then applied to the address predecoder 102. The address predecoder 102 decodes the first read column address RCOL1 and stores the predecoded address RCOL1 in a first of the interim address registers 104 by time t2. Before time t2, the first read column address RCOL1 becomes available at the output of the interim register 104 and is clocked through the auxiliary address multiplexer 106 and into the column decoder 84. The column decoder 84 decodes the read column address RCOL1 and provides a pulse to the selected column of the array 42 as indicated by the decoded column signal COL-DEC. The pulse of the decoded column signal COL-DEC arrives at the selected array column before time t2. In response to the decoded read column address RCOL1 (including the pulse of the decoded column signal COL-DEC) and the read command, the I/O interface 54 reads output data DOUT1 from the location indicated by the address RCOL1, as indicated by the signal line INTERNAL I/O DATA in FIG. 7. The output data DOUT1 arrive at a read data latch 105 at about time t2. The data DOUT1 then pass through the remainder of data output path 58 and reach the output data bus 60 by time t3, which is three clock edges following the first read command READ1.

A second read command READ2 and second read column address RCOL2 are applied to the SDRAM 100 at time t1, which is one clock cycle following the first read command READ1. The second read column address RCOL2 follows the same path as the first read column address RCOL1, except that the second read column address RCOL2 reaches each location in the column address path 76 one clock cycle later. The output data DOUT2 are thus available at the data bus 60 at time t4.

A third read command READ3 and a third column address RCOL3 are present at time t2, and the read process is repeated as described above. The corresponding output data DOUT3 reach the data bus 60 at time t5.

At time t3, a first write command WRITE1 and a first write column address WCOL1 are applied to the logic controller 48 and the address bus 52, respectively. The corresponding input data DIN1 arrive three clock edges later, at time t6, in order to match the read latency. The write column address WCOL1 passes along the column address path 76 through the column address counter/latch 78, multiplexer 79, and column address predecoder 102, as described above, and reaches the interim address buffers 104 at time t4. The write column address WCOL1 is loaded into the uppermost interim address register 104 as indicated at the signal line REG1.

Unlike the read column addresses RCOL1, RCOL2, RCOL3, the first write column address WCOL1 does not transfer quickly through the interim address register 104 to the auxiliary address multiplexer 106 and column address buffer 82 to the column decoder 84. Instead, the write column address WCOL1 remains in the uppermost interim address register 104 for a substantial period of time. In fact, the write column address WCOL1 remains in the uppermost interim address register 104 until the logic controller 48 determines that the corresponding input data DIN1 can be written to the array 42 without an address collision. Similarly, the input data DIN1 is stored in the uppermost interim data register 108 until it can be written to the array 42 without a data collision. The interval when input data can be written to the array 42 without an address or data collision will be referred to herein as an "available write interval."

To determine when an available write interval occurs and thus avoid data and address collisions, the logic controller 48 "looks ahead" to determine the usage of the array 42 in view of the latency of the SDRAM 100 and the commands and data following the first write command WRITE1. The determination of an available write interval can be seen by considering the time when the input data DIN1 can be written to the array.

First, the input data DIN1 corresponding to the write command WRITE1 do not reach the data bus 60 until time t6, because the write operation is a three-latency operation. Thus, the input data DIN1 cannot be written to the memory array 42 until after time t6. Consequently, the first write column address WCOL1 will not be transferred from the interim address register 104 to the I/O interface 54 until at least time t6, which is the clock edge on which the input data DIN1 reach the data bus 60.

Even though the input data DIN1 are available at time t6, the logic controller 48 still does not initiate transfer of the write column address WCOL1 at time t6. This is because the third command following the write command WRITE1 is a read command READ4 at time t6. The read command READ4 at time t6 means that the decoded read address RCOL4 will reach the I/O interface 54 two clock cycles later at time t8, at which time the output data DOUT4 will occupy the I/O interface 54 and array 42. To ensure that the decoded read command READ4 will arrive at the I/O interface 54 at time t8, the read column address RCOL4 exits the lowermost interim address register 104 between times t7 and t8. Thus, if the logic controller 48 were to transfer the write column address WCOL1 at time t7, both the write column address WCOL1 and the read column address RCOL4 would collide at the 110 interface 54 at time t8. Similarly, the input data DIN1 take at least one clock cycle to pass from the data bus 60 through the input data path 56 to the I/O interface 54. Thus, the input data DIN1 and the output data DOUT4 could also collide at the I/O interface 54.

The logic controller 48 also does not initiate transfer of the write column address WCOL1 at time t8 because a fifth read command READ5 arrives at time t7. The fifth read column address RCOL5 from the fifth read command READ5 applied at time t7 would thus occupy the I/O interface 54 and array 42 at or slightly before time t9. Consequently, the fifth read column address RCOL5 and the first write column address WCOL1 could collide at time t9 if the logic controller 48 initiated transfer of the input data DIN1 from the interim address register 104 at time t8. Also, the input data DIN1 and the output data DOUT5 could collide at time t9 under these conditions.

Likewise, the logic controller 48 does not initiate transfer of the write column address WCOL1 from the interim address register 104 at time t9, because of the address collision that could occur at time t10 between the first write column address WCOL1 and the sixth read column address RCOL6 from the sixth read command READ6 and because of the data collision that would occur between the input data DIN1 and the output data DOUT6.

As can be seen from the above discussion, the write column address WCOL1 remains in the interim address register 104 as long as read commands continue to be applied. However, once a write command (or any other command that will produce an opening at the I/O interface 56, such as a no operation NO-OP command) arrives, the logic controller 48 can predict that the memory array 42 will soon be available for writing (in two clock cycles).

At time t9, the fourth write command WRITE4 is applied to the logic controller 48. The fourth write command WRITE4 will not occupy the I/O interface 54 at time t11 because writes are three latency and the associated data DIN4 is not available yet. Consequently, the logic controller 48 determines that time t11 is an available write interval. Accordingly, at time t10, the logic controller 48 initiates transfer of the write column address WCOL1 from the uppermost interim address register 104 through the multiplexer 106 and column decoder 84 to the I/O interface 54. The write column address WCOL1 thus arrives alone at the 110 interface 54 at time t11.

The SDRAM 100 prevents data collisions at the I/O interface 54 in a similar fashion by holding the input data DIN1 in the uppermost interim data register 108 until time t10, which is one clock cycle before the available write interval of time t11. At time t10, the logic controller 48 initiates transfer of the input data DIN1 through the input data multiplexer 110 to the I/O interface 54, such that the input data DIN1 arrive at the I/O interface 54 at time t11. The I/O interface 54 writes to the array 42 at time t11, because both the first write column address WCOL1 and the corresponding input data DIN1 are present.

As can be seen from FIG. 7, a second write command WRITE2 and a second write column address WCOL2 reach the SDRAM 100 at time t4. The corresponding input data DIN2 arrive three leading edges later at time t7. As with the first write column address WCOL1, the second write column address WCOL2 passes through the column address path 76 to the interim address registers 104. When the second write column address WCOL2 arrives at the interim address registers 104, the uppermost interim address register 104 is already occupied by the first write column address WCOL1. Therefore, the second write column address WCOL2, is placed in the second interim address register 104 until a second available interval arrives at time t12.

In a similar fashion, the second input data DIN2 reach the data address bus 60 at time t7 and enter the second interim data register 108, because the first interim data register 108 is already occupied with the first input data DIN1. At time t11, the second input data DIN2 are transferred from the second interim data register 108, and reach the I/O interface 54 at the second available write interval at time t12. Thus, both the second write column address WCOL2 and the second input data DIN2 are available at the I/O interface 54 at time t12 and the second input data DIN2 are written to the array 42.

The above-described procedure is once again repeated for a third write command WRITE3 and third write column address WCOL3 that arrive at time t5 and their corresponding input data DIN3 that arrive at time t8. The third write column address WCOL3 occupies the third interim address register 104 and the third input data DIN3 occupy the third interim data register 108 until time t12 when they transfer to the I/O interface 54.

A fourth read command READ4 and fourth read column address RCOL4 reach the SDRAM 100 at time t6. As described above, the read column address RCOL4 passes through the column address path 76 to the interim address registers 104. The read column address RCOL4 passes directly through the fourth interim address register 104, and continues through the multiplexer 106 and the column decoder 84 directly to the I/O interface 54. The fourth read column address RCOL4 can pass undelayed because the first, second, and third write column address commands WCOL1, WCOL2, and WCOL3 are held in the first three interim address registers 104 until the read column address RCOL4 has left the 110 interface 54. The output data DOUT4 can pass through the I/O interface 54 to the output data path 58 at time t8 because the input data DIN1, DIN2, and DIN3 are held at the interim data registers 108 until after the output data DOUT4 pass through the output data path 58.

At time t7, a fifth read command READ5 reaches the SDRAM 100, and the above-described procedure is repeated such that the output data DOUT5 is available at time t10.

As described above, the SDRAM 100 can perform both reads and writes with three latency by temporarily storing the write column addresses and input data in the interim address and data registers 104, 108, thereby preventing data and/or address collisions at the I/O interface 54. One skilled in the art will recognize that the SDRAM 100 can perform subsequent reads and writes using N+1 interim address registers 104 where N is the latency of the SDRAM 100, regardless of the number of read commands that follow a write command and regardless of the number of write commands performed in sequence. Additionally, the SDRAM 100 can perform such sequential read and write operations using (N) interim data registers 108.

Figure 8:
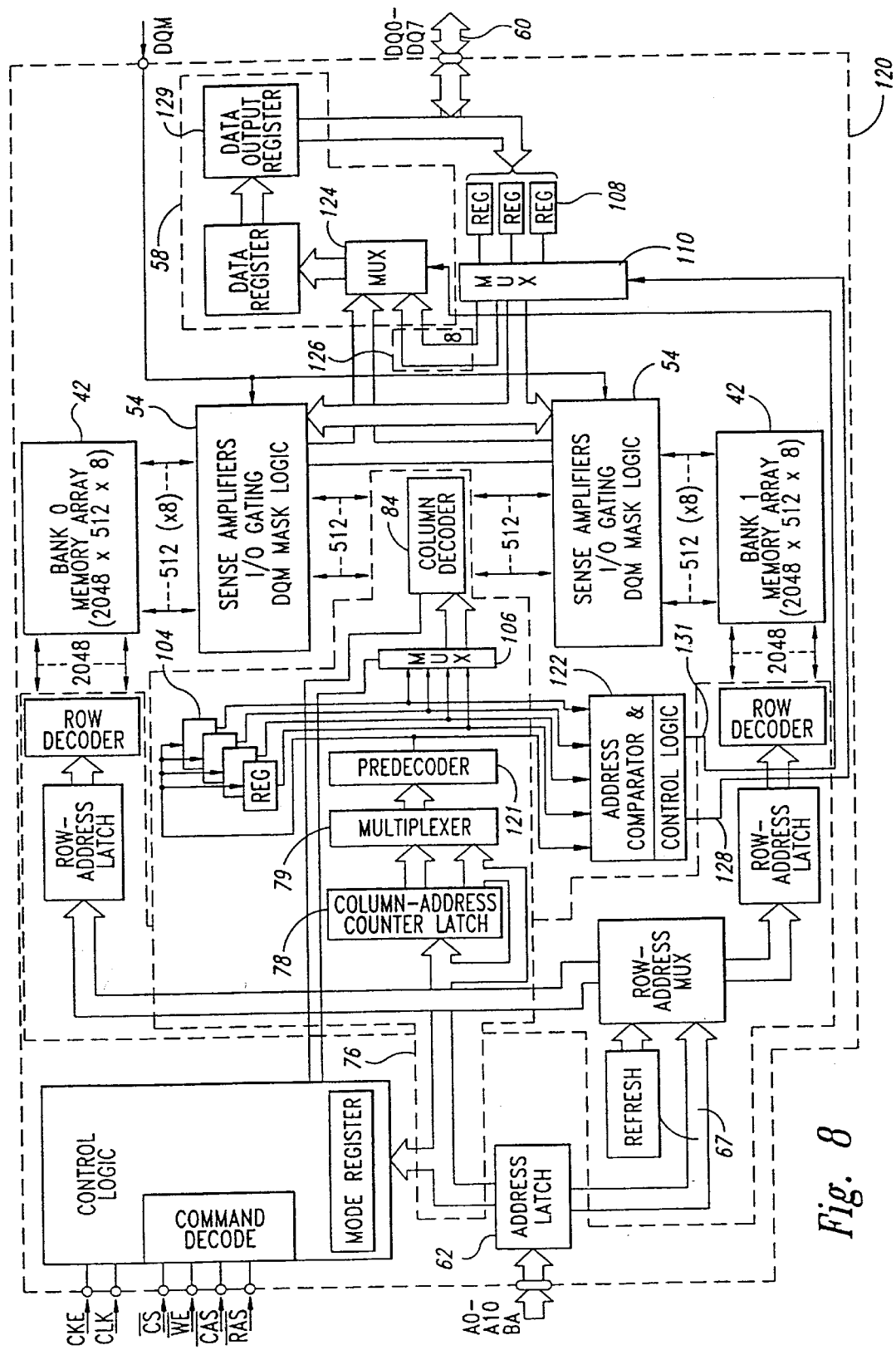
FIG. 8 is a block diagram of an SDRAM according to another embodiment of the invention, including interim address registers and interim data registers and an array bypass for reading data posted in the interim data registers.

FIG. 8 shows another embodiment of the SDRAM 100 that addresses the situation where a read command is directed toward an address that is currently being held in one of the interim address register 104. This situation may occur if, for example, the fourth read column address RCOL4 is the same address as the first write column address WCOL1. In this situation, the output data DOUT4 for the fourth read command READ4 should be the input data DIN1 from the first write command WRITE1. However, the array 42 would not yet contain the proper input data (input data DIN1), because the input data DIN1 has not yet been written to the array 42 from the first interim data register 108. Consequently, the SDRAM 100 could provide the incorrect data at the output data bus 60 in response to the fourth read command READ4.

The SDRAM 120 of FIG. 8 treats such situations internally by adding an address comparator 122 coupled to the interim address registers 104 and the predecoder 121. Additionally, the SDRAM 120 includes an output data multiplexer 124 in the output data path 58 that receives output data from the I/O interface 54 and that can receive input data from the interim data registers 108 through the input data multiplexer 110 via a bypass path 126.

Operation of the SDRAM 120 of FIG. 8, under normal conditions, is substantially the same as operation of the SDRAM 100 of FIG. 6. However, in the SDRAM 120, as each new address is output by the predecoder 121, the address comparator 122 compares the addresses in each of the interim column address registers 104 to the newly applied address. If the address comparator 122 detects that the arriving address is a read column address RCOL* that matches a write column address WCOL* in one of the interim address registers 104, the address comparator 122 produces control signals on control lines 128, 131, to control the input data multiplexer 110 and output data multiplexer 124. In response to the control signals, the multiplexers 110 provide the input data DIN* corresponding to the matching write column address WCOL* from the corresponding interim data register 108 to the bypass path 126. The output data multiplexer 124 supplies the re-routed input data DIN* from the bypass path 126 to an output data register 129, in place of the output data DOUT* from the I/O interface 54. The input data DIN* thus arrive at the data bus 60, rather than data read from the location in the array 42 corresponding to the matching read address RCOL*. Thus, the improper data from the array 42 are blocked from reaching the output data bus 60 and the proper data DIN* and reach the data bus 60 through the bypass path 126. Even though the input data DIN* follow the bypass path 126 to the data bus 60, the input data DIN* are still provided to the memory array 42 at the appropriate available write interval so that the incorrect data in the memory array 42 is replaced by the correct data DIN*.

The problem of such an incorrect data read may not be critical in all situations, because some applications may operate adequately with occasional data errors. One example of a possible noncritical error is in a two-dimensional video display application where a video image includes many thousands of pixels. If a very few of the data bits are incorrect, the effect on the overall image would be negligible. In fact, the number of bit errors will be low because the above-described read-following-write operations to common addresses are rare. Thus, the embodiment of FIG. 6 may be preferred in some applications because of its simplicity and speed. In other applications, where data integrity is important, such as accounting programs, the embodiment of FIG. 8 would be preferred. Alternatively, as discussed below, the embodiment of FIG. 6 may be used in applications requiring data integrity, by programming the logic controller 48 to block reading of data from not-yet-written addresses.

Also, in some applications, such as certain packetized systems or data networks, it may be desirable to select data from the memory array 42 rather than from the interim data registers 108 when the stored address matches an address in the interim address register 104. For example, such a capability may allow retrieval of a lost data packet in a packetized system. The logic controller 48 can implement such capability in the SDRAM 100 by selectively enabling or disabling the comparator 122 responsive to external commands or to a preprogrammed algorithm. Although the preferred embodiment of the invention avoids data collisions by temporarily storing the write data and write addresses while a read operation is processed, alternative techniques may be used. For example, a data collision resulting from a write followed by a read may be avoided by temporarily storing the read address in a temporary address buffer until the write data has been stored in the array. The read address is then transferred from temporary address buffer to the array for the read operation.

Figure 9:
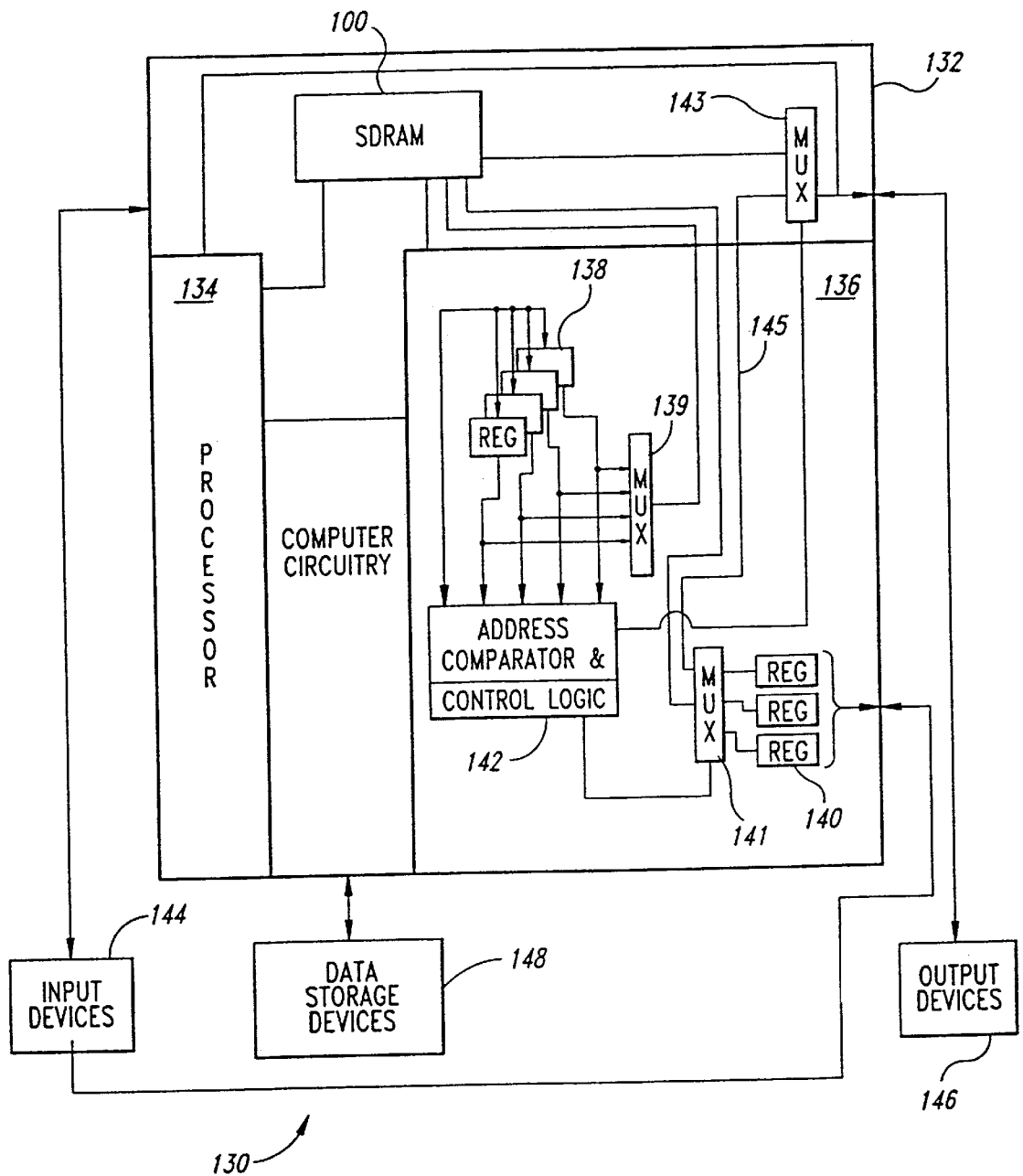
FIG. 9 is a block diagram of a computer system including the SDRAM of FIG. 6 or 9, including a memory controller, microprocessor, display device and input and output devices.

FIG. 9 is a block diagram of a computer system 130 that includes the SDRAM 100 and a memory controller 136. The computer system 130 includes computer circuitry 132 for performing such computer functions as executing software to perform desired calculations and tasks. The computer circuitry 132 typically contains a processor 134, the memory controller 136 and the SDRAM 100 as shown. One or more input devices 144, such as a keyboard or a pointing device, are coupled to the computer circuitry 132 and allow an operator (not shown) to manually input data thereto. One or more output devices 146 are coupled to the computer circuitry 132 to provide data generated by the circuitry to the operator. Examples of output devices 146 include a printer and a video display unit. One or more data storage devices 148 are coupled to the computer circuitry 132 to store data in or retrieve data from external storage media (not shown). Examples of storage devices 148 and associated storage media include drives that accept hard and floppy disks, magnetic tape recorders, and compact-disc read only memory (CD-ROM) readers.

The memory controller 136 provides an alternative structure for avoiding the above-described read-following-write to a common location for use with the SDRAM 100. To avoid such situations, the alternative memory controller 136 includes interim address and data registers 138, 140 and a comparator circuit 142 that temporarily store data and addresses and compare incoming read addresses to write addresses in the interim address registers 138 in the fashion described above with respect to FIG. 8.

If the comparator 142 does not indicate a match (i.e., an attempt to read data from an address that is not yet written), addresses and data are forwarded, in the order received, to the SDRAM 100 through multiplexers 139, 141. If the comparator 142 indicates a match (i.e., an attempt to read from a location that is not yet written), the comparator 142 activates multiplexers 141, 143 to direct data from the interim data registers 140 along a bypass path 145 to the output device 146 or the processor 134. As described above, the correct data are output immediately and are written later to the SDRAM 100 at an available write interval. Alternatively, the memory controller 132 may insert no operation NO-OP steps to delay the read command until after the write operation is completed.

While the present invention has been explained by way of exemplary embodiments, various modifications may be made without departing from the spirit and scope of the invention. For example, the computer system 130 of FIG. 9 can use the SDRAM 120 of FIG. 8 and thereby eliminate the interim address, data registers 138, 140, multiplexers 139, 141, 143, and comparator circuit 142. Also, the SDRAMs 100, 120 have been described as three-latency devices. However, the structures and methods described herein can be applied to SDRAMs having any latency. Also, the structures and methods described herein can also be applied to a variety of other synchronous devices, such as packet or protocol-type synchronous memory devices. Moreover, although the description of the exemplary embodiments herein describes application to a single memory array 42, one skilled in the art will recognize that the principles described herein are equally applicable to avoiding collisions, at subarrays or banks, and that references to the memory array 42 could also refer to memory subarrays or banks. Many other devices could be developed that operate the same way and would be within the scope of the invention. Accordingly, the invention is not limited except as by the appended claims.

What is claimed is:

1. A method of synchronously reading and writing data in a memory device having a memory array according to a clock signal defining a series of operational intervals, comprising the steps of:

providing a read command during a first operational interval;

providing a write command at a second operational interval immediately following the first operational interval;

in response to the read command, completing a read operation by coupling read data to data bus terminals at an Nth operational interval following the first operational interval by N−1 operational intervals, where the N is greater than or equal to 2;

in response to the write command, coupling write data from the data bus terminals at an (N+1)th operational interval following the first operational interval by N operational intervals; and completing a write operation using the write data coupled from the data bus terminals at the (N+1)th operational interval.

2. The method of claim 1 wherein the step of completing a write operation includes the steps of:

accepting a write address;

temporarily storing the write address;

accepting input data;

temporarily storing the input data;

detecting an available interval of the memory array; and writing the input data to the memory array at the detected available interval.

3. The method of claim 2 wherein the step of completing a read operation includes the steps of:

comparing a read address of the read operation to a set of write addresses;

if the read address matches any write address in the set of write addresses, reading data from an input data path before receiving the read address; and if the read address does not match any write address in the set of write addresses, reading data from a location in the memory array designated by the read address.

* * * * *

UNITED STATES PATENT AND TRADEMARK OFFICE
CERTIFICATE OF CORRECTION

PATENT NO. : 6,789,175 B2
DATED : September 7, 2004
INVENTOR(S) : Kevin J. Ryan and Terry R. Lee It is certified that error appears in the above-identified patent and that said Letters Patent is hereby corrected as shown below:

Column 1,
Line 34, "to develop signals; and" should read -- to develop signals, and --.
Line 63, "at a databus." should read -- at a data bus. --.

Column 4,
Line 24, "arrives at time to." should read -- arrives at time t0. --.
Line 40, "are repeated, one clock" should read -- are repeated one clock --.

Column 5,
Line 4, "reach the data bus" should read -- reaches the data bus --.

Column 6,
Line 6, "input data" should read -- input data in --.

Column 7,
Line 51, "at time to," should read -- at time t0, --.

Column 10,
Line 55, "has left the 110 interface" should read -- has left the I/O interface --.
Line 60, "command READS" should read -- command READ5 --.

Column 11,
Line 12, "address register 104." should read -- address registers 104. --.

Column 12,
Line 30, "transferred from temporary" should read -- transferred from the temporary --.

UNITED STATES PATENT AND TRADEMARK OFFICE
CERTIFICATE OF CORRECTION

PATENT NO. : 6,789,175 B2
DATED : September 7, 2004
INVENTOR(S) : Kevin J. Ryan and Terry R. Lee It is certified that error appears in the above-identified patent and that said Letters Patent is hereby corrected as shown below:

<u>Column 13,</u>
Line 25, "collisions, at subarrays" should read -- collisions at subarrays --.

<u>Column 14,</u>
Line 6, "where the" should read -- where --.

Signed and Sealed this

Twenty-eighth Day of February, 2006

JON W. DUDAS
*Director of the United States Patent and Trademark Office*